United States Patent
Tulloch et al.

(10) Patent No.: US 6,677,552 B1
(45) Date of Patent: Jan. 13, 2004

(54) SYSTEM AND METHOD FOR LASER MICRO-MACHINING

(75) Inventors: William Michael Tulloch, San Jose, CA (US); Alan Reilly Fry, San Jose, CA (US); Jeremy Weston, San Jose, CA (US); William Eugene White, Campbell, CA (US)

(73) Assignee: Positive Light, Inc., Los Gatos, CA (US)

( * ) Notice: Subject to any disclaimer, the term of this patent is extended or adjusted under 35 U.S.C. 154(b) by 0 days.

(21) Appl. No.: 10/150,822

(22) Filed: May 15, 2002

Related U.S. Application Data

(60) Provisional application No. 60/335,282, filed on Nov. 30, 2001.

(51) Int. Cl.$^7$ .............................................. B23K 26/38
(52) U.S. Cl. ............................................... 219/121.71
(58) Field of Search ................... 219/121.71, 121.67, 219/121.68, 121.69, 121.7, 121.72; 359/371

(56) References Cited

U.S. PATENT DOCUMENTS

| | | | |
|---|---|---|---|
| 4,684,436 A | 8/1987 | Burns et al. | |
| 6,034,349 A | * 3/2000 | Ota | ..................... 219/121.73 |
| 6,555,781 B2 | * 4/2003 | Ngoi et al. | ............ 219/121.67 |
| 6,577,394 B1 | * 6/2003 | Zavislan | ..................... 356/369 |

* cited by examiner

Primary Examiner—M. Alexandra Elve
Assistant Examiner—Jonathan Johnson
(74) Attorney, Agent, or Firm—Carr & Ferrell LLP

(57) ABSTRACT

System and method for laser micro-machining of crystalline and polycrystalline materials such as silicon that produces smooth surfaces. The invention is applied to integrated circuit applications including probing or modification of circuit components, electrical connections through silicon substrates, establishing ground plains within integrated circuits, and connections between circuits developed on opposing sides of a single substrate. Methods involve the use of femtosecond light pulses of short wavelength and circular polarization. A specific fluence region is used to obtain machined surfaces with smoothness to within one micron.

55 Claims, 14 Drawing Sheets

SYSTEM AND METHOD FOR LASER MICRO-MACHINING

CROSS-REFERENCE TO RELATED APPLICATIONS

Figure 1:
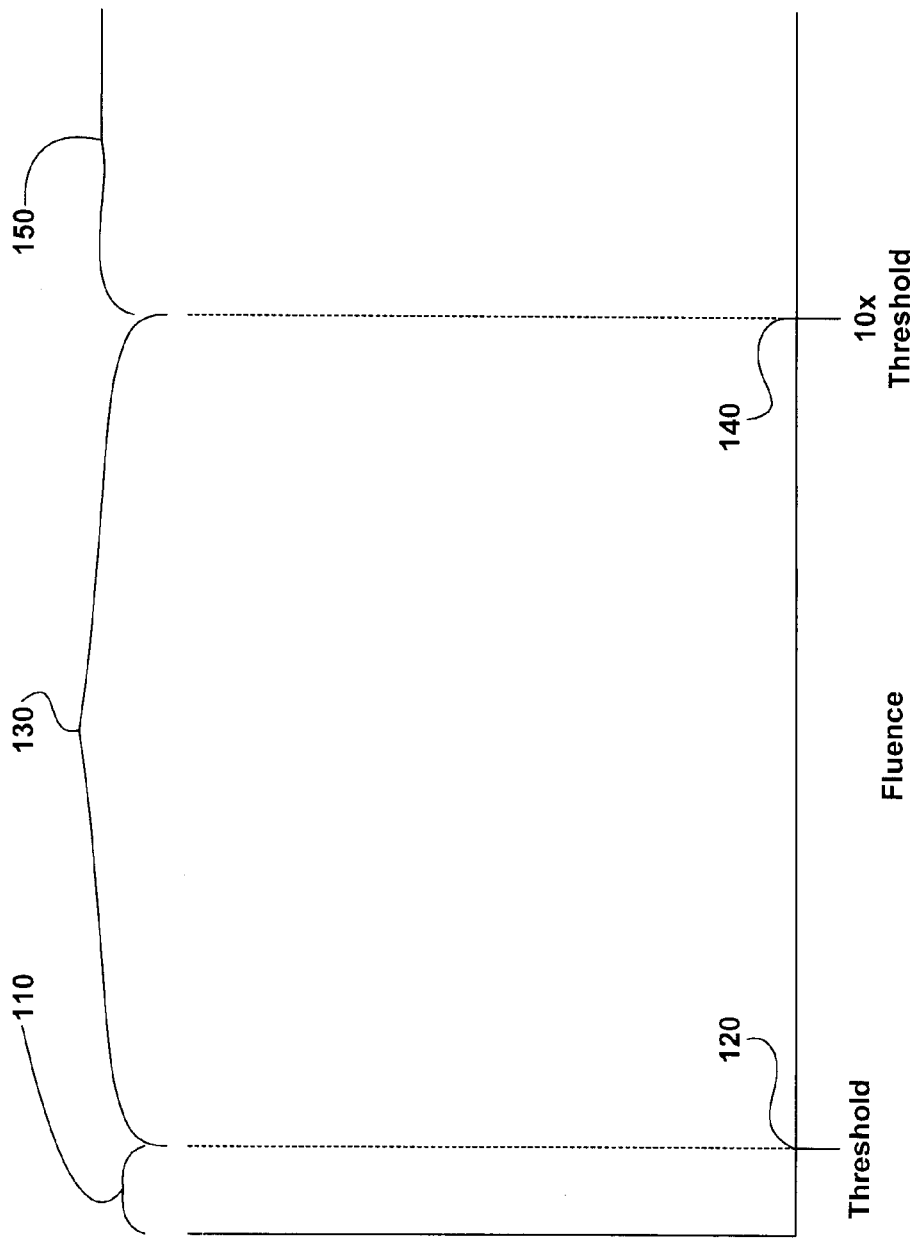

This application claims priority from commonly owned U.S. Provisional Patent Application No. 60/335,282 by William M. Tulloch et al., entitled "System and Method for Laser Micro-machining," filed Nov. 30, 2001. The disclosure of which is herein incorporated by reference.

BACKGROUND

1. Field of the Invention

The invention relates to laser machining and more particularly relates to laser machining of crystalline and polycrystalline materials and to silicon integrated circuit manufacturing and testing.

2. Description of the Prior Art

Lasers have been used for marking and machining of materials since shortly after their invention. Established techniques include laser cutting, drilling, and welding. These processes have been applied to a wide range of materials including, metals, ceramics, polymers, and natural-products such as cotton and paper.

Many types of lasers, including both continuous wave (CW) and pulsed systems, are used for material modification. In general, pulsed systems provide higher peak powers and CW sources provide greater total power. For pulse widths greater than 10 picoseconds the modification process is dependant on the ability of the material to adsorb the light. (Pulse widths are measured at FWHM.) The modification process is therefore wavelength dependant at power levels sufficient to machine materials. Light sources across a large region of the electromagnetic spectrum are, therefore, used for machining. These include $CO_2$ lasers in the infrared and excimer lasers in the ultraviolet. It has been believed that wavelength is less important when pulse widths are shorter than approximately 10 picoseconds.

In contrast, the lengths of laser pulses are known to be important parameters in many instances. Fluence, or energy per unit area, is also a critical factor. Short and powerful pulses produce results markedly different from long and less powerful pulses.

The effects of fluence and pulse length are in part due to the different processes that can occur in laser machining. These include heating and melting, blasting, and plasma development. Heating and melting are the result of thermal effects wherein photon energy is absorbed by the target and converted into thermal energy. A thermally affected zone is one in which material has been heated to the extent that its chemical or electrical functionality are changed. For example, when laser machining occurs near an integrated circuit, the thermally affected zone is the volume within which a state or operation of the integrated circuit is changed or a property that affects a state of the integrated circuit is changed. As the material is heated it melts and a thermally affected zone often extends beyond the area on which light is incident. Blasting is the result of sudden thermal excitation wherein rapid expansion causes material to be blown off of the target. Plasma may also form if the material is heated rapidly. Plasmas imply that electrons have attained sufficient energy to escape from the protons they are normally associated with. Due to the presence of free electrons, energy can travel very rapidly in plasmas. Heating times and cooling mechanisms can also be very important to laser machining processes. The rate at which energy leaves the affected area helps determine the characteristics of the machined material. For example, it is well known that the smoothness of holes drilled in thin metal sheets is much greater for picosecond laser pulses than for nanosecond pulses. Femtosecond laser micro-machining is essentially a non-thermal machining process. Energy is transferred to the material lattice in a picosecond time scale, resulting in a rapid formation of a plasma that expands and expels the vaporized material from the surface.

It is known in the current art that various levels of laser fluence have different effects on a machined surface. FIG. 1 illustrates these regions as expected on a metal surface. In a first region 110 laser pulses have no effect on the material. A second region 130 begins at a damage threshold 120 and continues until a fluence of roughly ten times threshold 140 is reached. In the second region 130 the material is modified but not removed. A third region 150, above ten times threshold 140, is characterized by significant material modification and removal. The difference between the two thresholds 120 and 140 varies widely as a function of the material and fluence of the light. Generally, it is believed that the polarization and wavelength of the light used is unimportant.

Laser machining is most commonly used for metals, ceramics, natural products, and polymers. Other materials such as crystals, polycrystals, or glasses have been described as "problem materials" in the field. Such materials can have very high melting points or not adsorb photons at the easily produced wavelengths. An example of such a material is silicon. Silicon easily adsorbs light but traditionally forms irregular surfaces when laser machined. Silicon has a damage threshold fluence of roughly 0.13 $J/cm^2$ for 795 nanometer light.

Silicon is a very important material in the electronics industry wherein wafers are used in the manufacture of integrated circuits. There is a significant need for machining silicon with the accuracy and precision required in the integrated circuit industry. Silicon is currently machined using techniques such as grinding or ion beam etching. Grinding is used to remove bulk material but can thermally damage any existing circuits. Ion beam etching on the other hand has the precision and accuracy required but is an extremely slow process.

There are a number of applications that would greatly benefit from improved silicon machining techniques. For example, to test circuits it is advantageous to insert a probe through the backside of the silicon substrate on which the circuit has been built. In current technology ion beam etching is used to drill a hole through the substrate to the circuit to be tested. This process can take many days or even weeks and, therefore, is not practical for frequent use. Lack of a more practical machining process also limits the ability to quickly make connections between integrated circuits on either side of a flat substrate.

Figure 2:
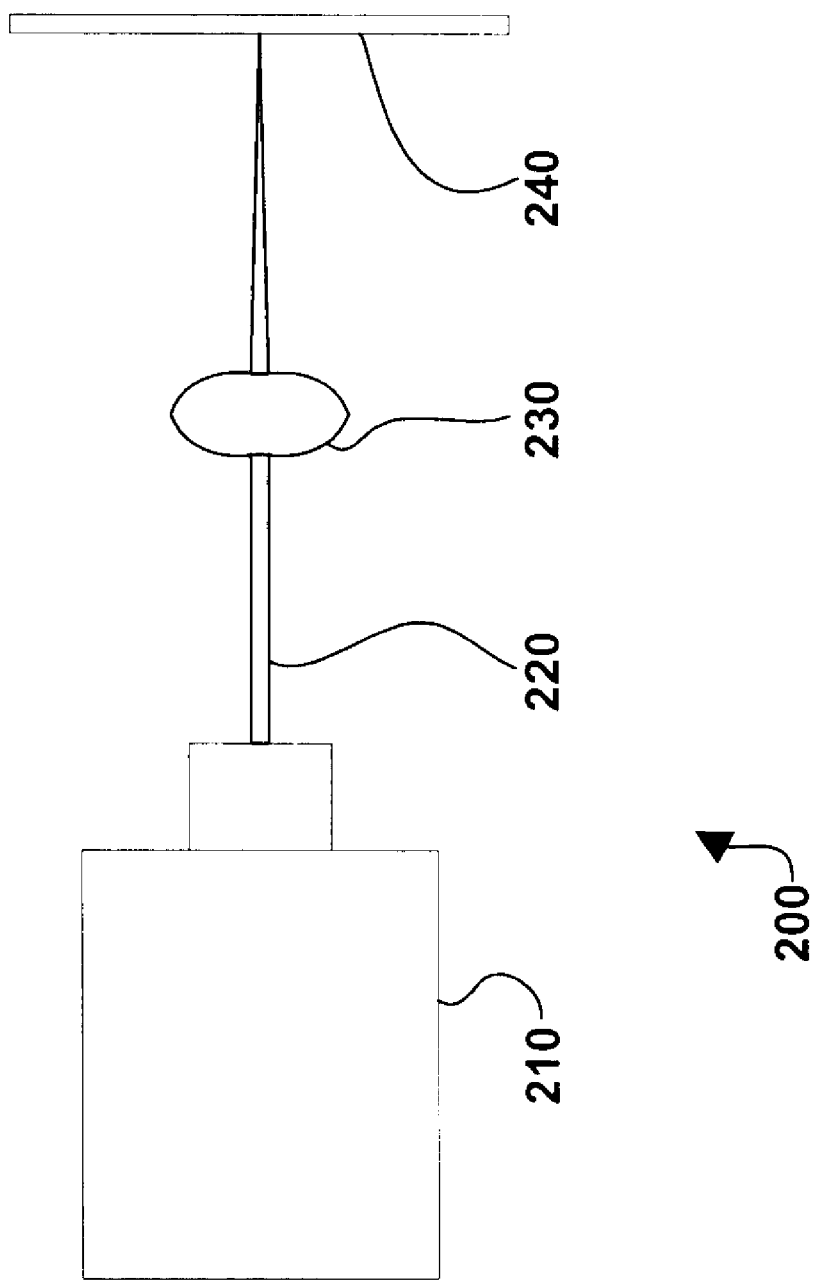

FIG. 2 shows a block diagram of a prior art laser machining (or marking) system generally designated 200 and including a laser 210 that produces a light beam 220. Beam 220 is manipulated by a wide variety of optional optics 230 and is finally directed at a target 240.

Figure 3:
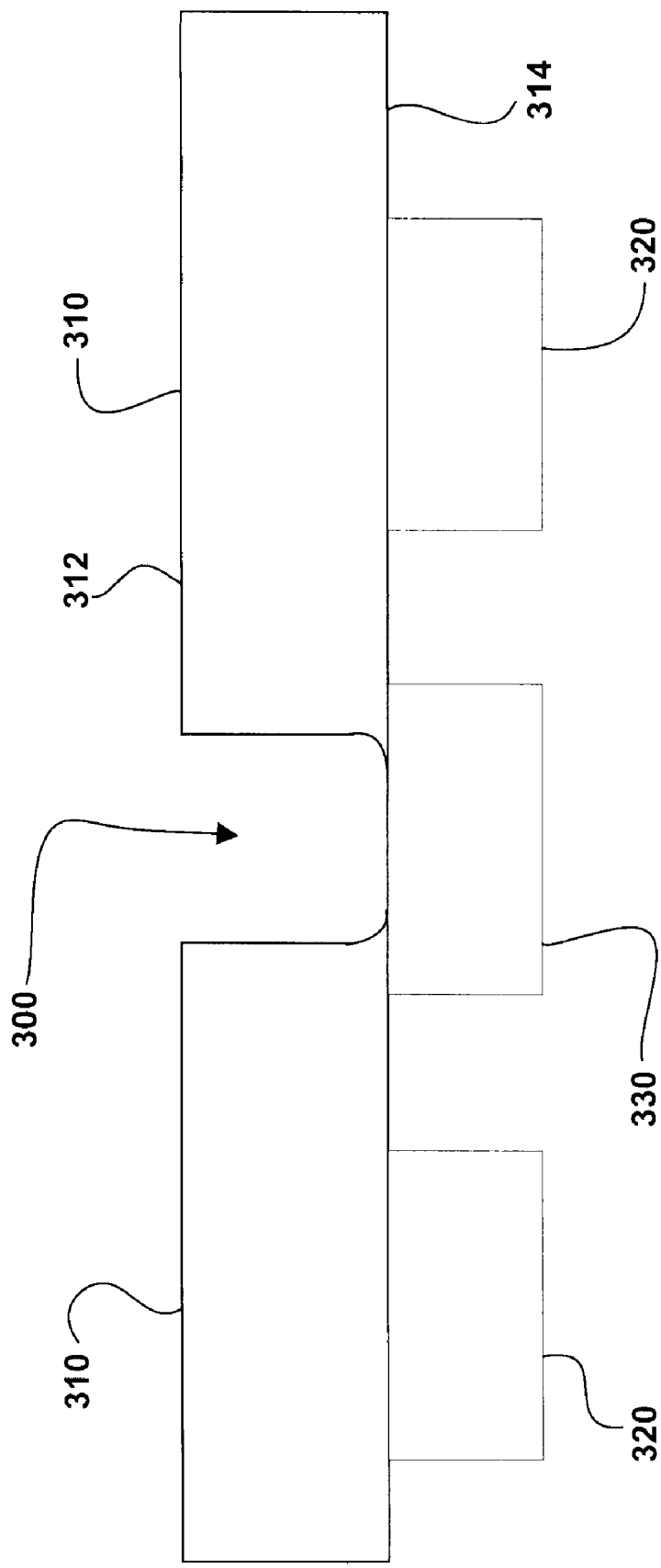

FIG. 3 illustrates a hole, generally designated 300, drilled using prior art ion beam etching methods. Hole 300 is made in the silicon substrate 310 using a beam of high-energy ions (not shown). The beam slowly sputters material from substrate 310. Typical removal rates are on the order of 100 cubic microns per second. A 500 by 500 by 100 micron hole therefore requires about 3 days at 100 Hz. Hole 300 is made from a backside 312 of substrate 310 to a front side 314. Front side 314 optionally supports various electronic components 320. For example, in FIG. 3, hole 300 is located across from a circuit of interest 330.

Figure 4:
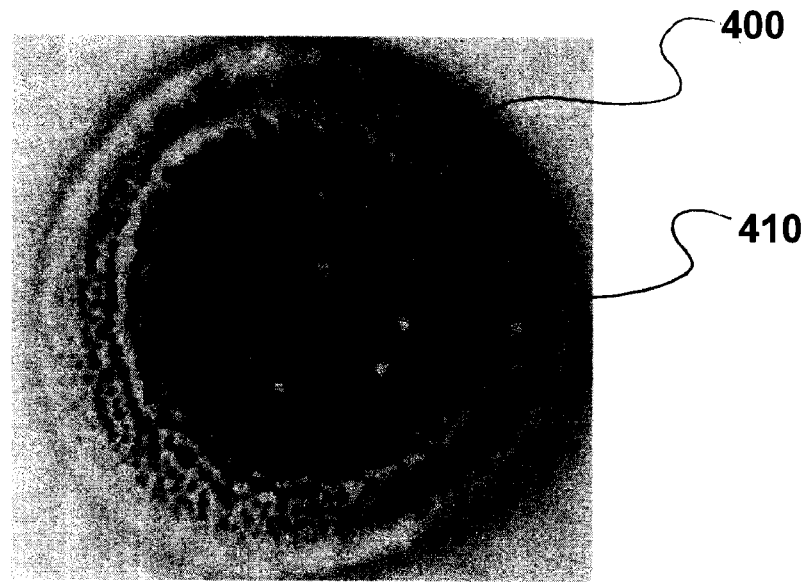

FIG. 4 is a micrograph of a hole generally designated 400 laser drilled in silicon using methods of the prior art. The hole has a diameter of about 70 microns. Hole 400 was drilled at a fluence of 4.6 times threshold 120. Bright spots 410 in the center of the hole are peaks of spikes that can rise several microns above the original surface. These are believed to occur as a result of plasma condensation processes. At other fluences pits can occur in the bottom surface of the hole (not shown). These spikes and pits, such as illustrated in FIG. 3, have prevented laser machining from replacing conventional ion beam etching processes in many applications.

Figure 5:
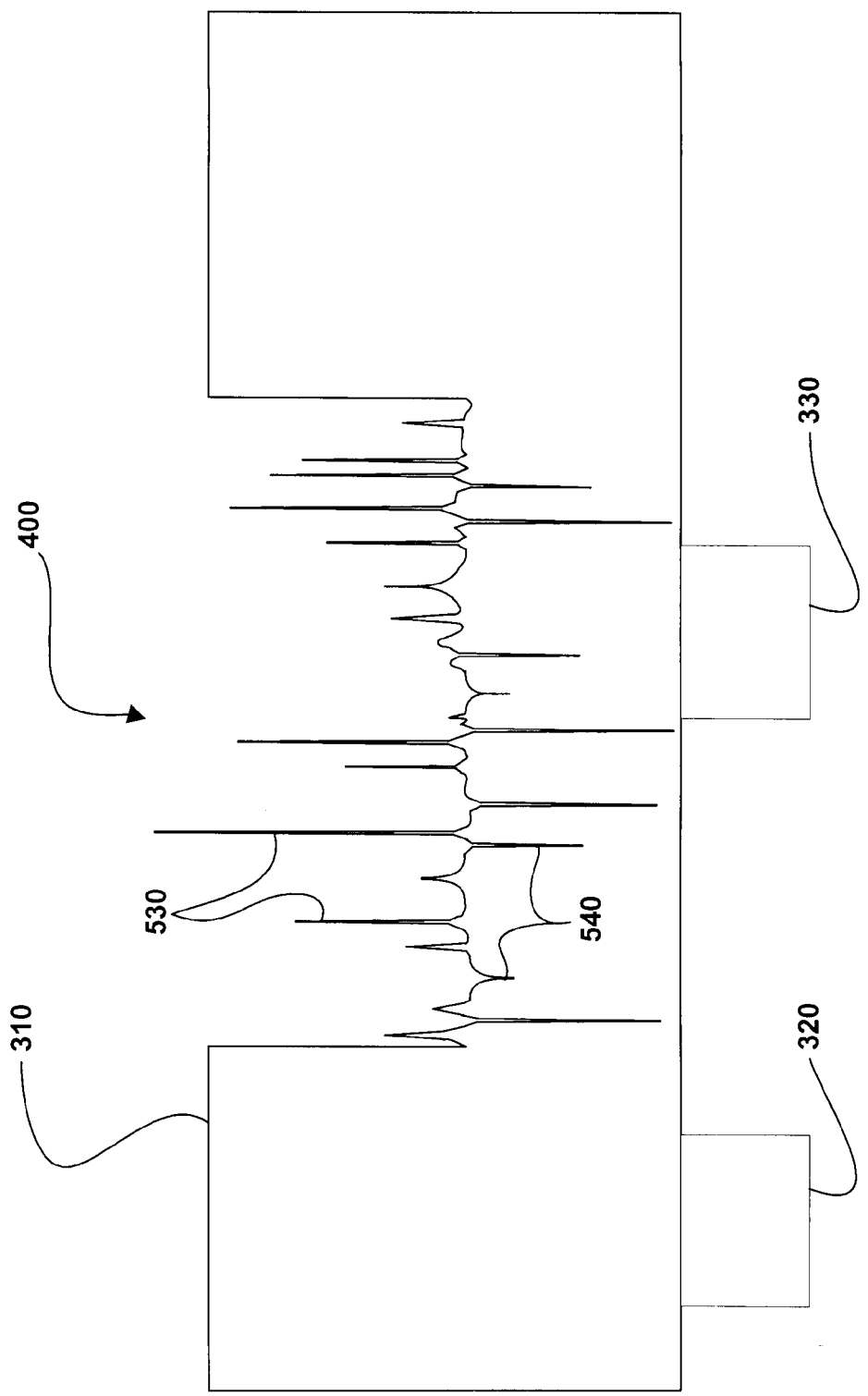

FIG. 5 is a cross-sectional illustration of the pertinent features of hole 400 shown in FIG. 4. The hole 400 is made in a silicon substrate 310 on which integrated circuits 320 and 330 have been manufactured. The bright spots 410 (FIG. 4) are shown as spikes 530 and pits 540 are also visible. Spikes 530 and pits 540 prevent further machining without affecting the circuit of interest 330 because the bottom surface 510 of hole 400 has become too irregular.

There therefore exists a significant need in the art of silicon machining for a system and method of micromachining holes in silicon that produce more desirable surface characteristics, in less time, and without significant peaks and pits.

SUMMARY OF THE INVENTION

Systems and methods are disclosed for producing smooth bottomed holes in poly-crystalline materials using laser micro-machining techniques. Surface smoothness of better than 0.5 micron RMS is attained, where smoothness is determined over a 100×100 micron area. The micro-machining method includes laser pulses whose fluences fall within a region that removes material at an economically viable rate but does not produce significant irregular features such as pits and spikes.

Methods include the use of preferred laser pulse widths, wavelengths, and polarization. One embodiment includes providing a laser system, producing a pulsed laser beam using the laser system, and focusing the laser beam with a focusing optic onto the surface of the material to be modified. The material is supported in a position relative to the focused laser beam, and portions of the material are removed using the pulsed laser beam in a manner such that a surface that is smooth to within 2 microns RMS (root mean squared) is produced, material is removed at an average rate greater than 12 cubic per pulse, and a thermally affected zone penetrates less than 5 microns from the machined surface. In alternative embodiments material is removed at average rates greater than 1 cubic micron per pulse or greater than 6 cubic microns per pulse. These per pulse removal rates are possible at pulse repetition rates equal to or greater than 1000, 5000, 10,000, 50,000, or 100,000 Hz.

Uses of the described for the micro-machining methods include machining silicon substrates used in electronics applications. Systems enabled by the micro-machining methods, and within the scope of the present invention, include devices for probing or modifying circuits through holes made in silicon substrates, electrical connections through substrates, and connected circuit systems occupying both sides of a substrate.

Embodiments of the invention include systems for machining poly-crystalline materials. These systems include a laser system for generating a pulsed laser beam capable of removing material at an average rate greater than 12,000 cubic microns per second, generating thermally affected zones that penetrate less than 10 microns from the machined surfaces, and producing a machined surface smooth to within 5 microns RMS. The laser beam is directed, using a focusing optic, at a support system for positioning the poly-crystalline material in relation to the laser system.

BRIEF DESCRIPTION OF THE VARIOUS VIEWS OF THE DRAWING

Figure 6:
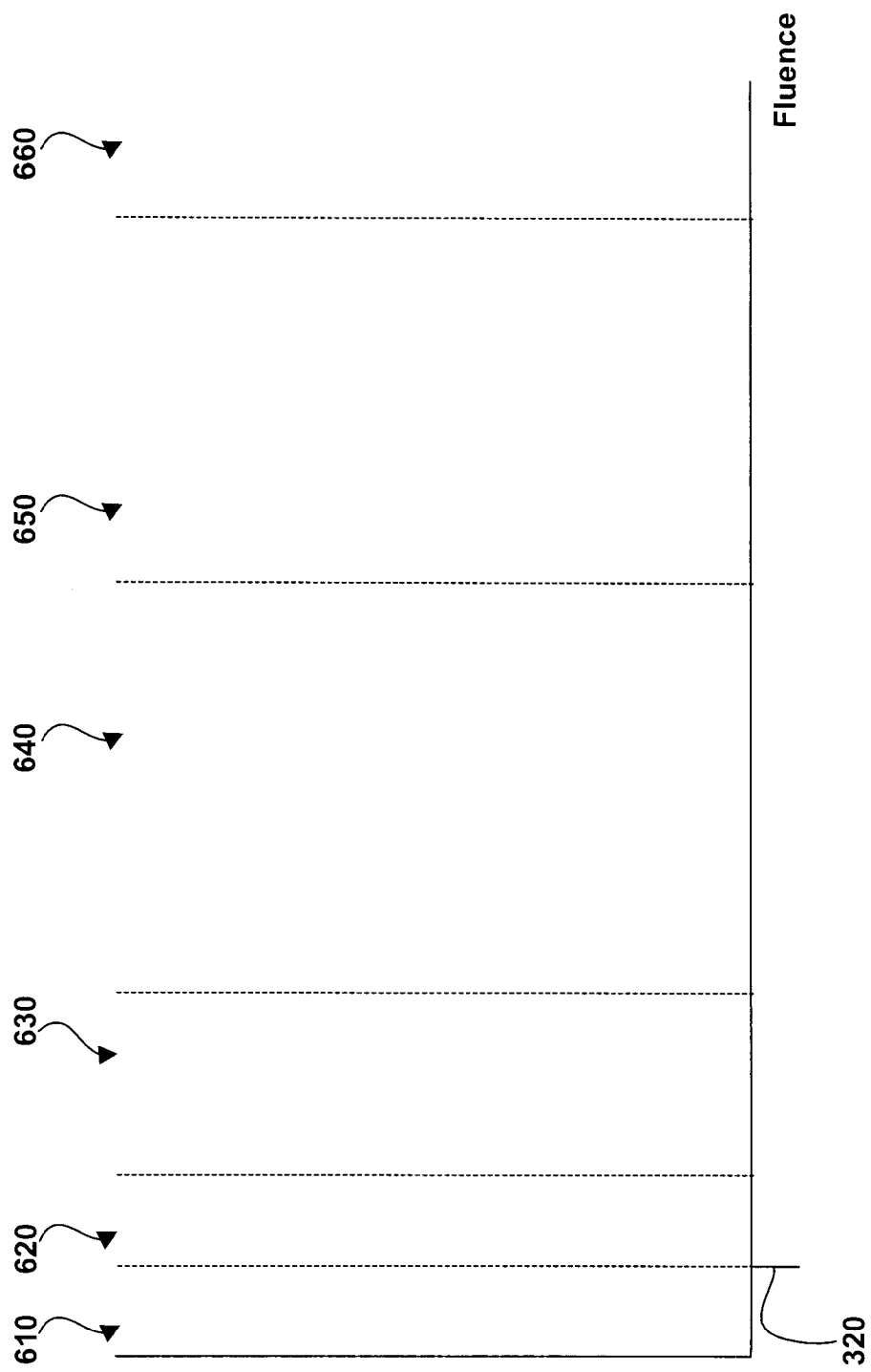
Figure 7:
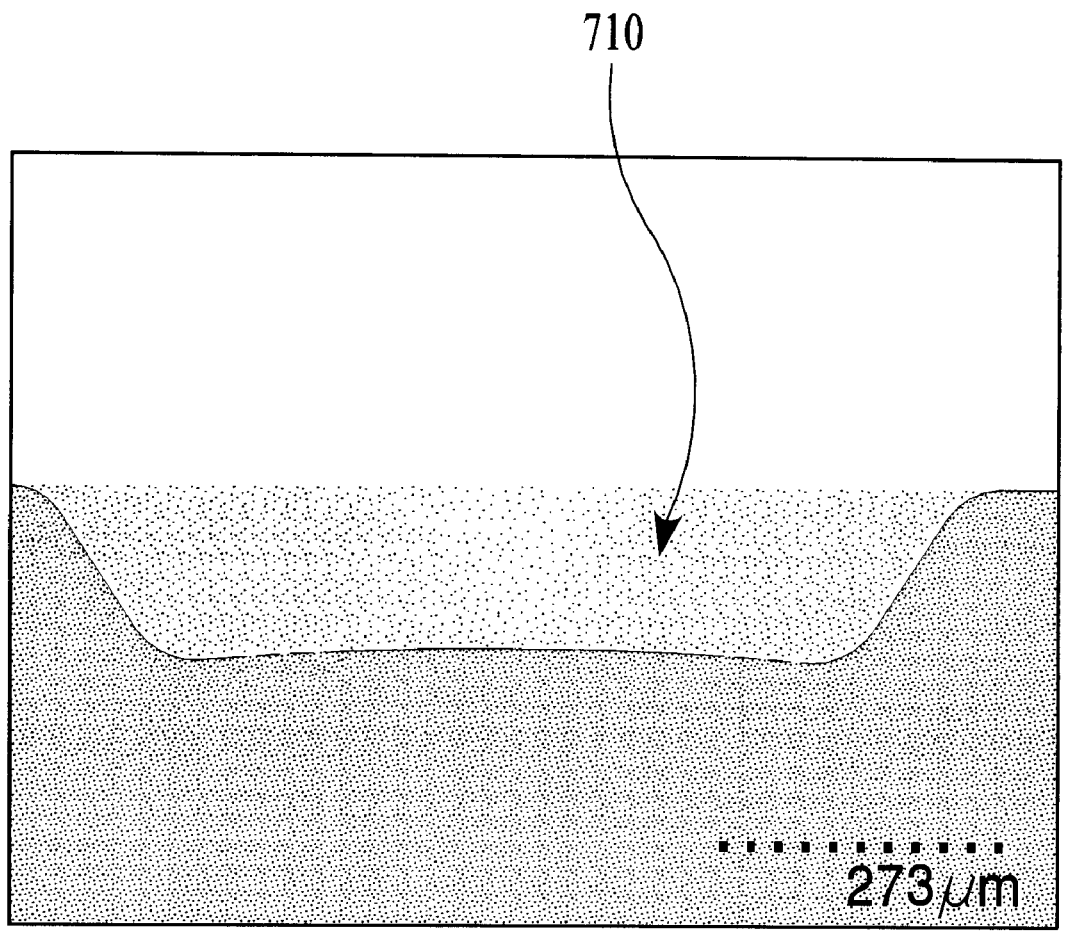
Figure 8:
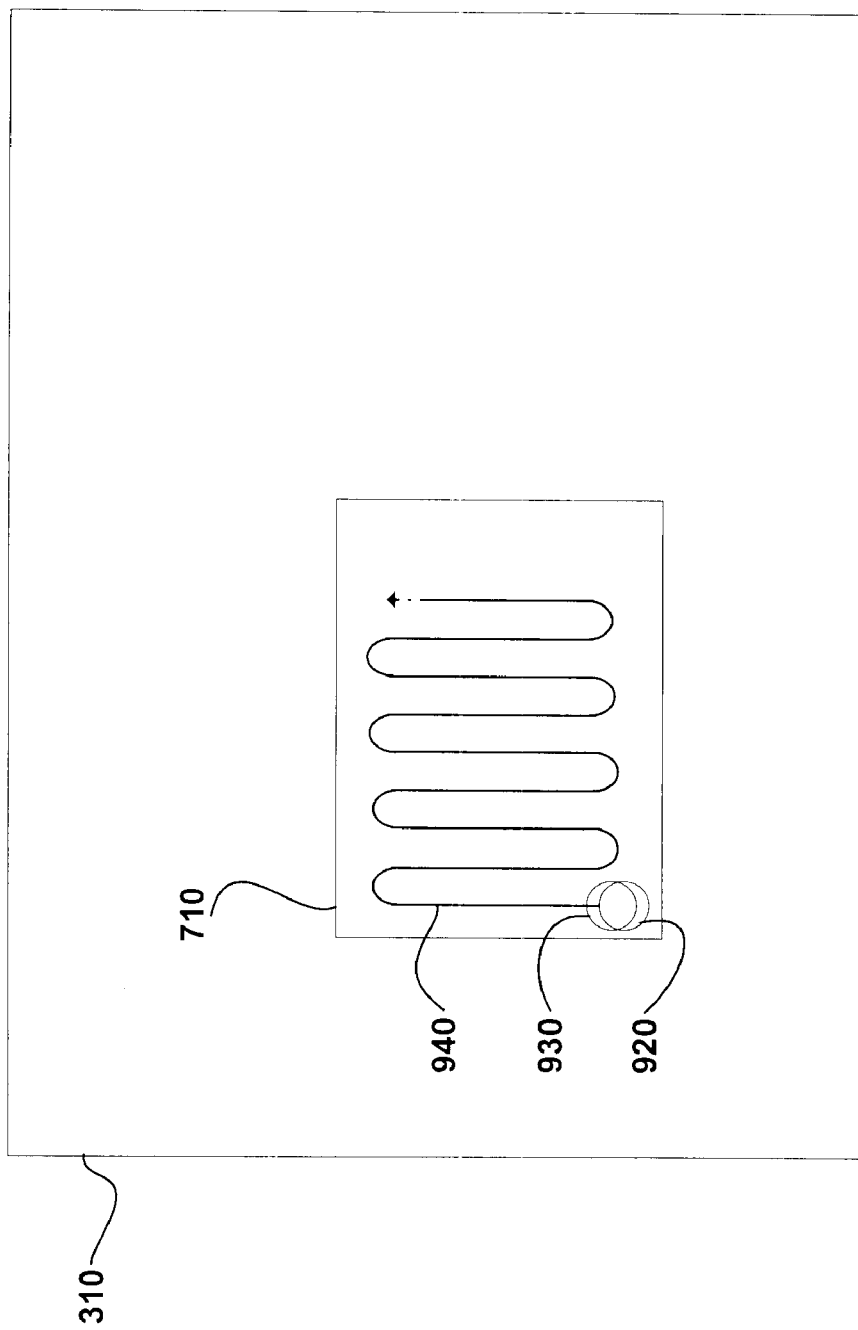
Figure 9:
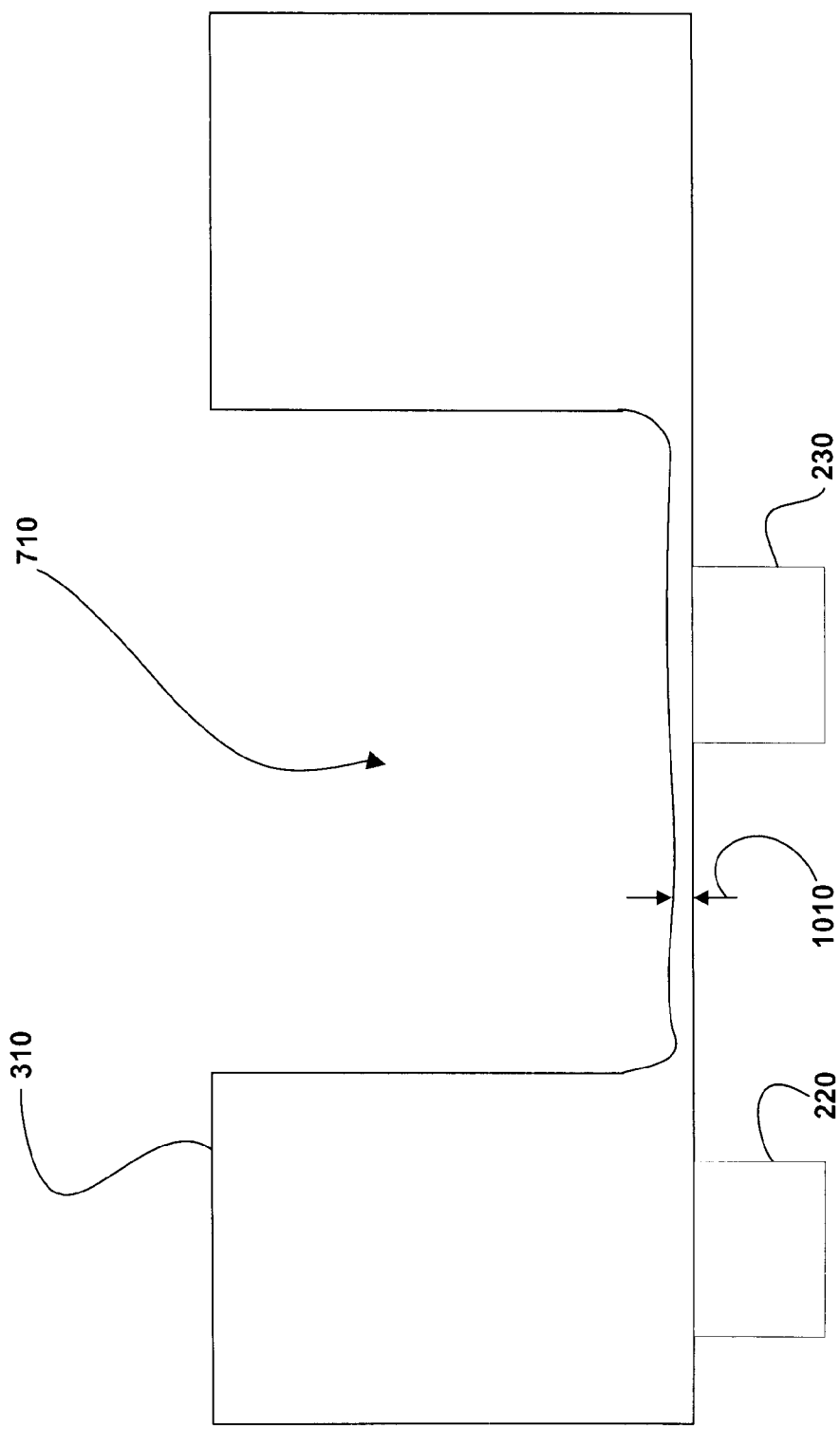
Figure 10:
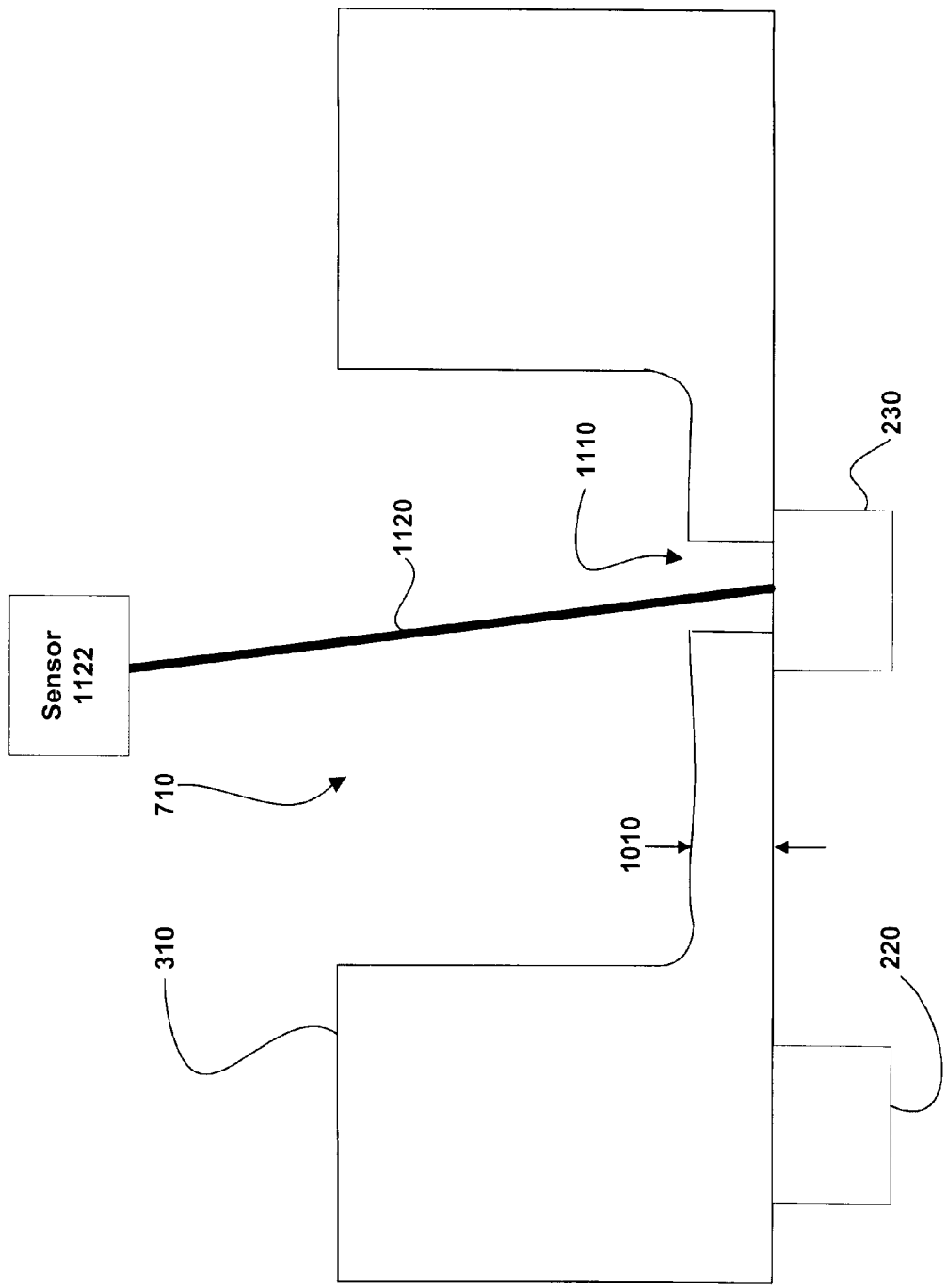
Figure 11:
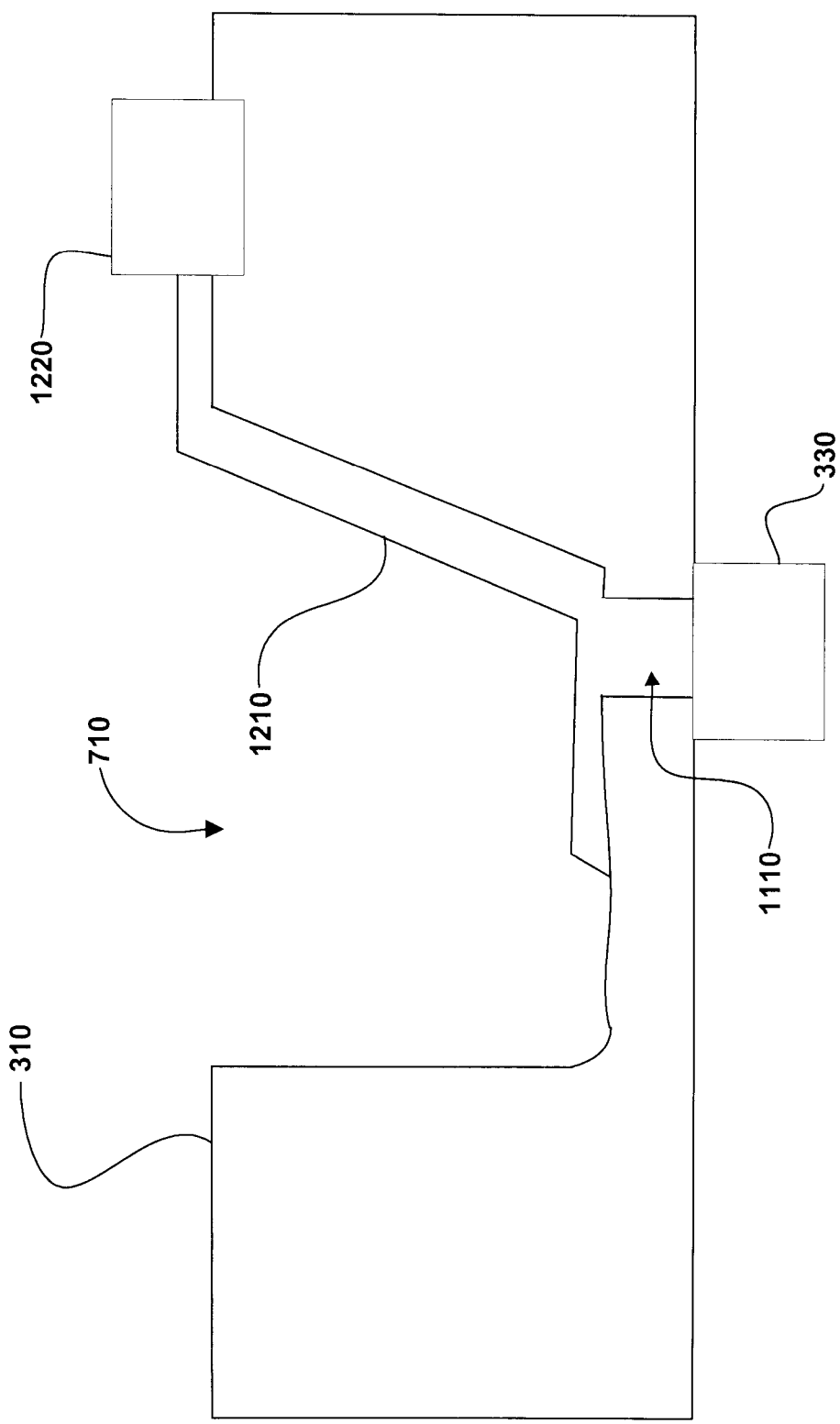
Figure 12:
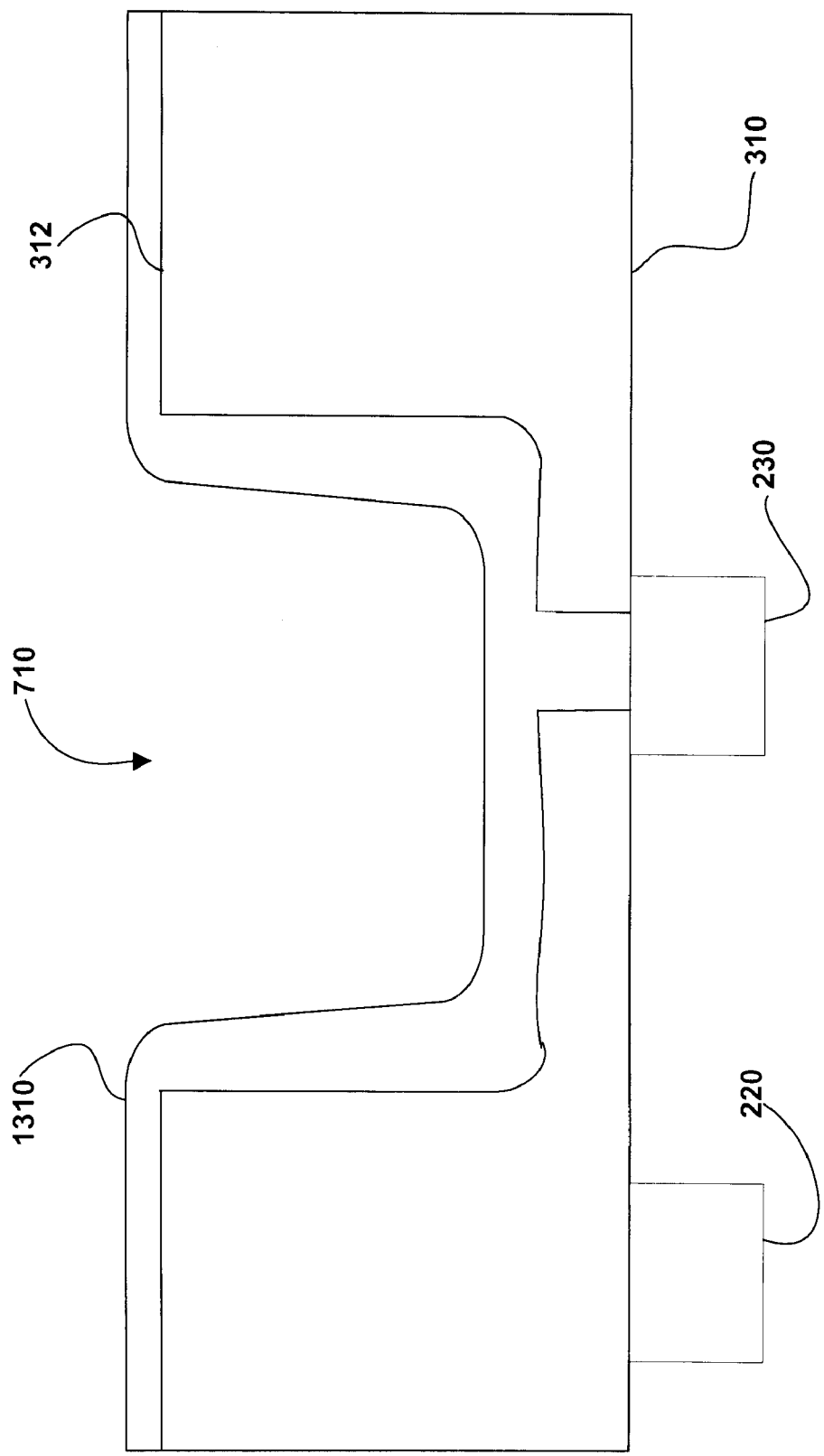
Figure 13:
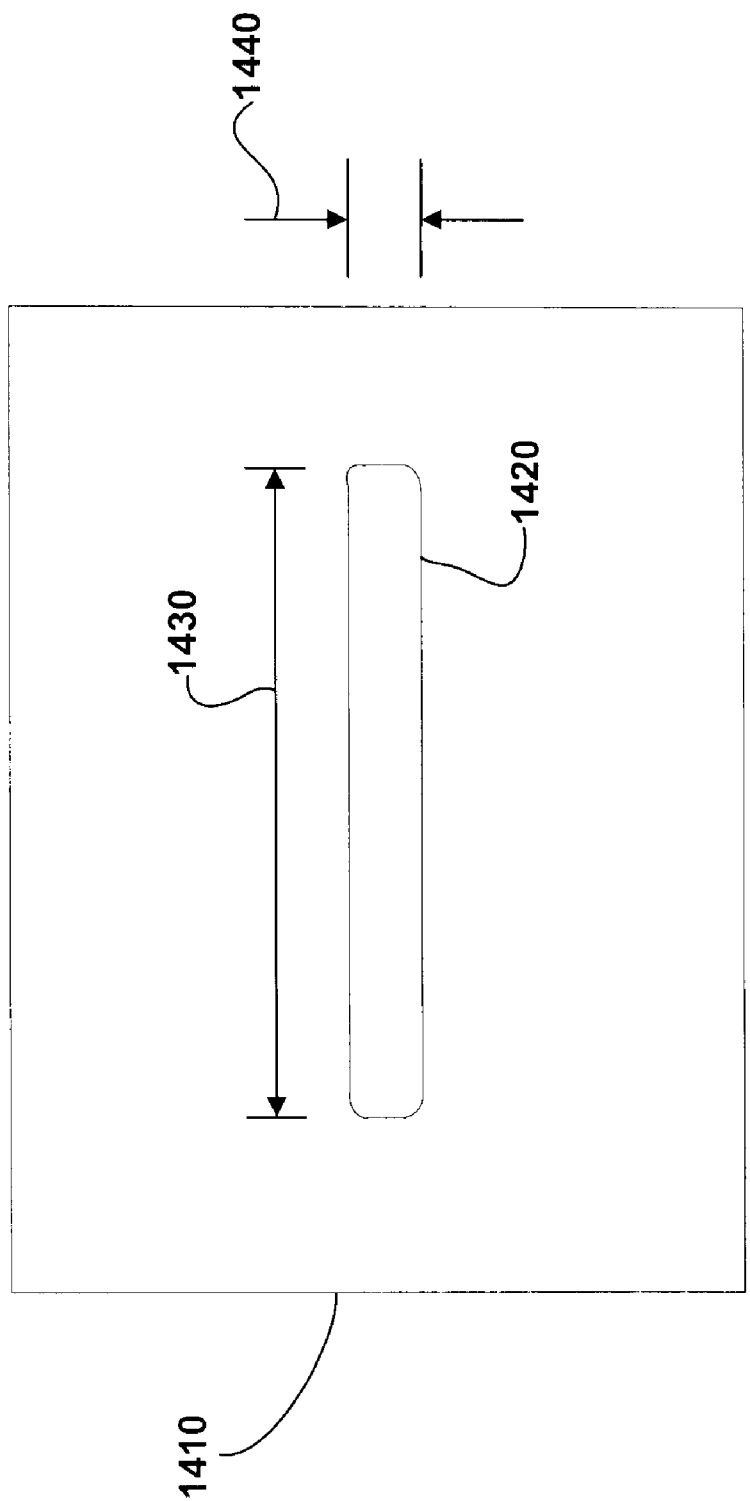

1) FIG. 1 illustrates ways in which lasers affect a surfaces as a function of fluence as understood in the prior art;

2) FIG. 2 illustrates a prior art system for laser machining of materials;

3) FIG. 3 illustrates a hole drilled in a semiconductor device using prior art ion beam techniques;

4) FIG. 4 is an image of a hole drilled in silicon using a prior art laser pulse;

5) FIG. 5 illustrates pertinent features of the prior art hole shown in FIG. 4;

6) FIG. 6 illustrates ways in which lasers effect surfaces as a function of fluence in accordance with an embodiment of the invention;

7) FIG. 7 is a cross-sectional illustration of a hole drilled in silicon using an embodiment of the invention;

8) FIG. 8 illustrates a possible hole drilling process in accordance with an embodiment of the invention;

9) FIG. 9 illustrates the pertinent features of the hole shown in FIG. 7;

10) FIG. 10 illustrates a technique for passing a probe, to an electrical circuit, through a silicon substrate in accordance with an embodiment of the invention;

11) FIG. 11 illustrates circuit connections through a silicon substrate in accordance with an embodiment of the invention;

12) FIG. 12 illustrates connections through a silicon substrate to a ground plain in accordance with an embodiment of the invention; and 13) FIG. 13 illustrates a hole with a high aspect ratio in accordance with an embodiment of the invention.

Figure 14:
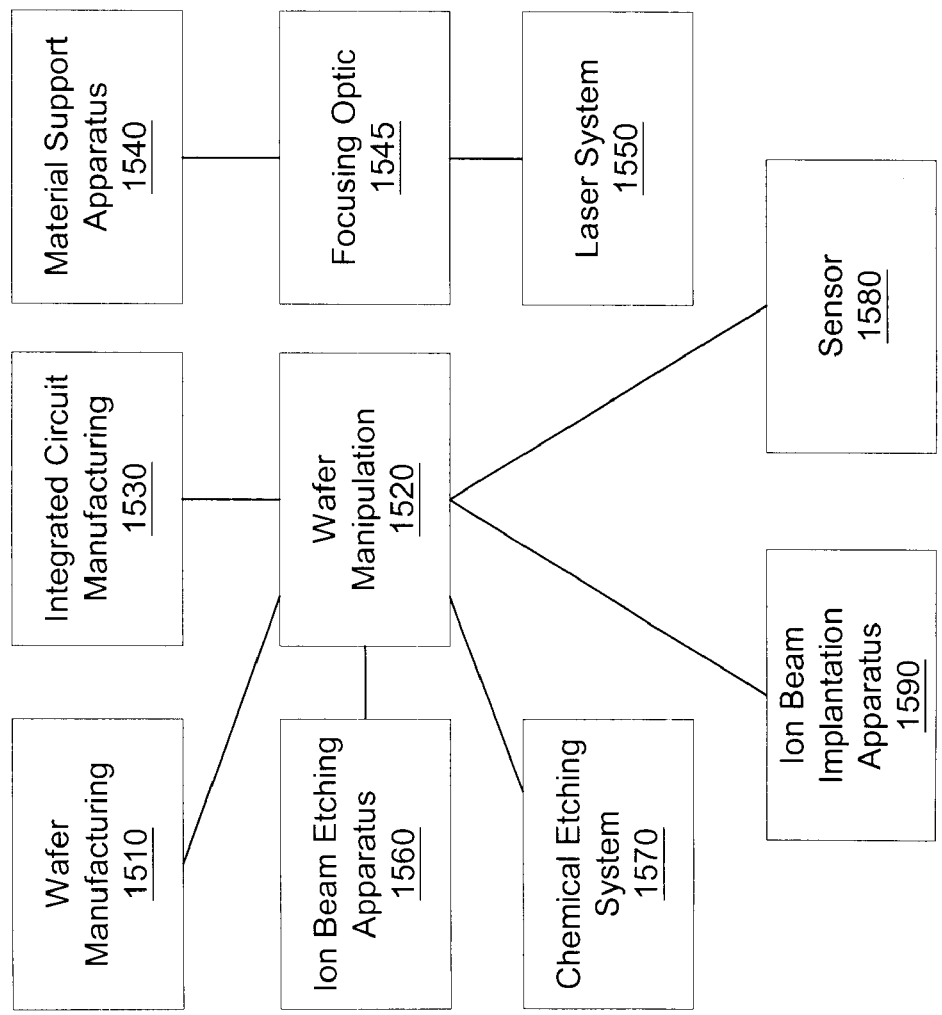

14) FIG. 14 illustrates an embodiment of the invention including a wafer manufacturing system.

DETAILED DESCRIPTION OF THE INVENTION

FIG. 6 illustrates different regions in which varying fluences of femtosecond laser pulses affect a silicon surface according to an embodiment of the invention. As shown, there are at least five fluence regions that generate distinct results. In a first region 610, the surface is not affected. In a second region 620, material is removed at a very low ablation rate. In a third region 630, material is removed at a practical rate and a surface with sub-micron features can be produced. In a fourth region 640, a large number of pits 540 and spikes 530, larger than 4 microns or larger than 10 microns, are generated. (Pits and spikes are measured in height and depth respectively.) In a fifth region 650, smooth surfaces are produced but surface melting occurs. In a sixth region 660 the surface is substantially disrupted and a large heat affected zone is generated. An embodiment of the invention employs a laser fluence within the third region 630.

FIG. 7 is a cross-sectional illustration of a hole, generally designated 710, drilled in silicon using an embodiment of the invention. The silicon wafer was mounted in a supporting apparatus and the hole is 650 and 850 microns wide across the bottom and top respectively. The depth is one 135 microns in the center and 158 microns at the edges. Hole 710 was produced using light with a wavelength of 400 nm, a pulse width of approximately 130 femtoseconds and a repetition rate of 1000 Hz. Similar results are obtained for other pulse widths less than either 10, 5 or 1 picoseconds (FWHM—Full Width Half Maximum), at repetition rates greater than 10 Hz, and at other wavelengths less than 400 nm. The circularly polarized beam was focused, using optics, to a 20 micron diameter spot and rastered over the surface. Alternative embodiments utilize elliptically polarized beams. Each pulse had an energy of 6.5 microjoules. Material was removed at an average rate of 12,000 cubic microns per second or 12 cubic microns per pulse. Removal rates scale linearly with pulse repetition rates. For example, embodiments including repetition rates greater than or equal to 500, 5,000, 10,000 or 50,000 Hz can achieve removal rates greater than or equal to 6,000, 60,000, 120,000 or 600,000 cubic microns per second, respectively. Any average removal rate above 10,000 cubic microns per second has an economic advantage. Contrary to prior art methods, it was found that both polarization and wavelength were important parameters for machining flat surfaces in silicon. Shorter ultra-violet wavelengths and more circularly polarized light showed improved results.

FIG. 8 illustrates a hole drilling process. In order to make the hole 710 in a silicon substrate 310, a laser beam is generated and focused on an initial spot 920. After a chosen number of laser pulses the laser beam is moved relative to the substrate 310 such that the beam is focused on a new spot 930. This process is continued along a path 940 covering the entire hole 710. In each of several passes a layer of material is removed until the hole has reached a desired depth. The raster pattern is optionally rotated 90 degrees between each pass.

It is an aspect of some embodiments of the invention to produce laser machined surfaces, such as hole bottoms, that are smooth enough for further machining to be applied through other techniques such as ion beam etching. This aspect enables a process in which the first stage of a machining step involves the laser micro-machining methods of the invention and the second involves other processes. For machining steps, such as hole drilling, the methods of the invention provide unique combinations of removal rates, thermal properties, and surface flatness.

The characteristic sizes and spacings of features that contribute to roughness at the bottom of a laser drilled hole, such as hole 710, vary as a function of the laser polarization, raster pattern, pulse fluence, pulse width and the distance of the translation of the laser focal point between shots. In one embodiment the roughness of a hole bottom is further reduced by randomizing the characteristic feature sizes generated on a pulse-to-pulse basis by changing characteristics of the pulses. In one embodiment the roughness of a hole bottom is further reduced by varying the spacing between the focal points of successive laser shots. In these embodiments, varying the size and spacing of individual features prevents constructive interference between these features that may lead to an increase in their size.

In one embodiment a modified use of a regenerative amplifier or other lasing cavity is used to vary feature size on a pulse-to-pulse basis. The regenerative amplifier or other lasing cavity is operated in two alternative pulse modes, a single pulse mode and a burst pulse mode. In the single pulse mode pulses are generated one at a time at the pulse repetition rate. In the burst pulse mode a group (burst) of pulses are generated each time the amplifier fires, the firings occurring at the "pulse repetition rate." A pulse burst will typically contain a pulse train of 5 to 10 pulses. The pulses within a pulse train will be separated in time by the roundtrip time of the cavity. The pulse energy and pulse width of the pulses within the burst will vary as a function of the gain in the cavity seen by each individual pulse. This variation changes the peak fluence and is used to randomize the characteristic sizes of features on a hole bottom, resulting in reduced overall roughness on the hole bottom. Not all of the pulses in the burst are required to be in the preferred fluence regime.

In alternative embodiments other means are used to vary pulse to pulse characteristics of the laser output. Alternative embodiments also include mechanical means of changing the distance the laser beam focal point is translated between pulses and means of changing the raster pattern. In selected cases, wherein specific features are desired on a machined surface, the machining process is designed to selectively control the production of regularly spaced features. The generation of these features optionally includes use of constructive interference between surface characteristics resulting from separate laser pulses.

FIG. 9 illustrates a possible relationship between hole 710, produced using a method in accordance with the invention, and integrated circuits 320 and 330 formed on or in contact with silicon substrate 310. In one embodiment, hole 710 is machined to within a very short distance 1010, such as 3, 5, 10, or 20 microns, of circuit of interest 330. Using methods of the invention the thermally affected zone and any pits penetrate less than the short distance 1010 from the bottom of hole 710. In various embodiments the depth of the thermally affected zone is less than 1, 2, 5 or 10 microns. Hole 710 can, therefore, be made without changing properties of circuit 330. In addition, since methods of the invention eliminate generation of significant spikes, further machining methods, such as ion beam etching, are optionally applied to the bottom of hole 710 after laser machining.

FIG. 10 illustrates a technique for making contact with a conductor through a silicon substrate according to one embodiment of the invention. Hole 710 is further extended by an additional hole generally designated 1110 that reaches to circuit of interest 330. Hole 1110 is made using alternative machining techniques such as ion beam etching. Since the distance 1010 between the bottom of hole 710 and the circuit of interest 330 is typically only be a few microns, ion beam etching of hole 1110 can be preformed as a rapid step. Once hole 1110 is produced an optional probe 1120, connected to a sensor 1122 is coupled to the circuit of interest 330. Probe 1120 is electrical, mechanical, or optical. For example, in various embodiments probe 1120 is a conductor, a chemical probe, or a fiber optic. Sensor 1122 is used to detect a signal that passes from the circuit of interest 330. The sensor includes mechanical, electrical, or optical components.

Embodiments of the invention include systems for performing modifications or repair of circuit of interest 330. Access through hole 1110 enables modification or repair of circuit of interest 330. In several embodiments this is accomplished by adding or removing (exchanging) material with the circuit of interest 330 through hole 1110. The exchanging process optionally includes ion beam etching, ion beam implantation, vapor deposition, and mechanical manipulation, or the like. In other embodiments circuit of interest 330 is modified by applying energy to circuit of interest 330 through hole 1110. The energy is optionally electrical, photonic, or thermal.

FIG. 11 illustrates an example of circuit connections through silicon substrate 310. Since hole 710 provides a path through the substrate 310 a connection 1210 is optionally made between circuit 330 on the front side of substrate 310 and circuit 1220 located on the back side of substrate 310. In one embodiment hole 710 is made prior to the manufacture of circuits 1330 or 1220 or prior to final steps in the preparation of substrate 310. Hole 710 penetrates entirely through the substrate 310 or, optionally, is in combination with a hole 1110 as shown in FIG. 10. Connections through a silicon substrate enable construction of linked circuits on both sides of a substrate.

FIG. 12 illustrates use of hole 710 to enable connections through a silicon substrate to a ground plane 1310 according to one embodiment of the invention. The ground plane 1310 is a conductive layer deposited on the backside of substrate 310. Connection to a ground plane allows more precise definition of voltage levels and more rapid transitions between voltages levels. Ideally these connections should be distributed throughout a circuit (e.g. not merely at edges). More precise voltage levels permit high and low states (the 1's and 0's of digital data) that are closer together. For example, 0 to 1.5 Volt levels can be used instead of 0 to 3, or 0 to 5 Volt levels. Small differences between voltage levels reduce the transition time between levels, the power required by the circuit, and the heat generated by the circuit. All of these factors are critical to the performance of integrated circuits. Ground plane connections at one or more points also increase circuit speed by reducing the path over which current must flow to reach a reference voltage. Use of hole 710 for ground plane connection, therefore, enables a variety of means by which circuit speed is increased. Ground plane 1310 covers part of backside 312 of substrate 310 and holes 710 are optionally located in a plurality of places within this area. Similar planes, at other reference voltages (such as the "high" voltage level), optionally cover other parts of backside 312 of substrate 310 and be connected to the front side through holes similar to hole 710. These provide advantages similar to that of ground plane connections. In one aspect of the invention, connections to ground or reference voltage planes are positioned to improve circuit speed. In one embodiment connected ground or reference voltage planes are also used for electromagnetic shielding.

In addition to the simple holes discussed above, embodiments of the invention include performing a number of additional micro-machining operations in silicon. For example, holes at angles of other than 90 degrees to the substrate surface, holes with overhanging edges, holes with high aspect ratios, and other applications in which smooth surfaces are required. In one embodiment holes are made through multiple layers of different materials. In various embodiments hole 710 has a depth greater then 500 microns, or less than or equal to 500, 250, 100, 50 and 25 microns.

FIG. 13 illustrates an example of a hole 1420 with a smooth bottom, made in silicon substrate 310, with an aspect ratio of 0.5 (depth/width). In this case the aspect ratio is the ratio of the length 1430 to the width 1440. However, an aspect ratio can also refer to the ratio of width 1440 to depth. For example, using the method of the invention a 100 micron deep hole may have a width of only 200 microns.

In one embodiment, methods of the invention are executed using apparatus that includes a system for manipulating and manufacturing substrate wafers (such as silicon wafers), systems for forming and testing integrated circuits on the wafers, ion beam and buffered oxide etching systems, laser and material positioning systems, and ion beam implantation and vapor deposition systems. The invention produces unique circuits and materials with associated machined surfaces, interconnections, electrical or optical properties, or probe access points. Embodiments of the invention are, therefore, associated with substrate wafer manipulation or manufacturing apparatus as well as systems for manufacturing and testing integrating circuits.

FIG. 14 illustrates an embodiment of the invention including a wafer manufacturing system 1510 configured to manufacture wafers of poly-crystalline materials. Manufactured wafers are moved to an integrated circuit manufacturing system 1530 using a wafer manipulation system 1520. Wafer manipulation systems is configured to moved wafers between many components of the invention. To perform a hole generating process the wafers are moved, using wafer manipulation 1520, form integrated circuit manufacturing 1530 to material support apparatus 1540. Material support apparatus is part of a support system that is optionally used to change the position of the wafer relative to a focusing optic 1545 that is used to focus a laser beam generated by a laser system 1550. After hole generation wafer manipulation 1520 is used to move the wafer to an optional chemical etching apparatus 1560 to further smooth machined surfaces. Chemical etching apparatus 1560 optionally includes any of the well known systems for chemically etching a material. After chemical etching wafer manipulation 1520 is used to move the wafer to an optional ion beam etching system 1570 used to extend the generated hole. The integrated circuit is optionally moved to a sensor 1580 for testing or an ion beam implantation apparatus 1590 for modification.

From the description of the various embodiments of the process and apparatus set forth supra, it will be apparent to one of ordinary skill in the art that variations and additions to the embodiments can be made without departing from the principles of the present invention. For example, the methods and systems of the invention are advantageously applied to a wide variety of polycrystalline materials such as silicon, diamond-like graphite, sapphire, glasses, diamond, crystals, $Al_2O_3$, BeO, Aluminum nitride, and other crystalline materials. Any material with a region similar to region 630, shown in FIG. 6, benefits from the identification of a similar region and use of fluences within that region for laser machining. The methods and systems of the invention are applied to electronic, optical, or electromagnetic circuits.

The "silicon substrate" or "silicon wafer", used for illustrative purposes above, is optionally substituted for by any silicon, ploy-crystalline, or similar material forming a substrate wafer of arbitrary shape. For example, the "silicon wafer" or "silicon substrate" is optionally a diamond or diamond-coated surface. The "silicon substrate" can be any substrate on which integrated circuits are manufactured and can, therefore, also be one of several substrate layers that occur in multi-layer integrated circuit assemblies. In multi-layer integrated circuits holes can be located in substrates on either side of a circuit element. Holes can be either blind (with bottoms) or through (open at both ends).

We claim:

1. A method of laser machining a material comprising the steps of:

providing a laser system;

producing a pulsed laser beam using the laser system;

focusing the laser beam with a focusing optic;

supporting the material to be machined in a position relative to the focused laser beam; and removing portions of the material using the pulsed laser beam in a manner such that a surface smooth to within 2 microns RMS are produced, material is removed at an average rate greater than 12 cubic microns per pulse, and a thermally affected zone penetrates less than 5 microns from the surface.

2. The method of claim 1, wherein material is removed at an average rate greater than 6,000 cubic microns per second.

3. The method of claim 1, wherein the thermally affected zone penetrates less than 2 microns from the surface.

4. A method of laser machining a material including silicon comprising the steps of:
   forming an integrated circuit on the material to be machined;
   providing a laser system;
   producing a pulsed laser beam characterized by pulse widths of less than one picosecond as measured at half the maximum intensity of the pulses, using the laser system
   circularly polarizing the laser beam;
   focusing the pulsed laser beam with a focusing optic;
   supporting the material to be machined in a position relative to the focused laser beam;
   removing portions of the material using the pulsed laser beam at an average rate greater than 12,000 cubic microns per second;
   etching the surfaces using a chemical etch such that the surfaces are smooth to within 1 micron RMS;
   ion beam etching the surface; and
   moving the relative positions of the material to be machined and the laser beam.

5. A method of laser machining a poly-crystalline material comprising the steps of:
   generating a pulsed ultra-violet laser beam; and
   removing portions of the material using the laser beam in a manner such that,
      a surface smooth to within 6 microns RMS is produced,
      a thermally affected zone penetrates less than 1 micron from the smooth surface, and
      the material is removed at an average rate greater than 12,000 cubic microns per second.

6. The method of claim 5, wherein the poly-crystalline material includes silicon.

7. The method of claim 6, further including the step of circularly polarizing the laser beam and wherein the surface is smooth to within 1 micron.

8. The method of claim 5, further including the step of generating the laser beam in a manner such that pulse widths are less than 10 picoseconds.

9. The method of claim 5, further including the step of generating the laser beam in a manner such that pulse widths are less than 1 picosecond.

10. The method of claim 5, further including the step of ion beam etching the produced surface.

11. The method of claim 5, further including the step of applying a chemical etch such that a surface smooth to within 0.5 microns RMS is produced.

12. The method of claim 5, further including the step of moving the relative positions of the laser beam and the poly-crystalline material in a raster pattern.

13. The method of claim 5, further including the steps of
   moving the relative positions of laser beam and the poly-crystalline material in a raster pattern, and
   generating a hole with depth to width ratio of 0.2 or greater (depth/width).

14. The method of claim 5, wherein the poly-crystalline material includes diamond.

15. A method of manufacturing a blind hole in poly-crystalline material comprising the steps of:
   generating a pulsed ultra-violet laser beam using a laser;
   directing the pulsed ultra-violet laser beam at a surface of the material; and
   removing portions of the material from the directed surface to form the blind hole in a manner such that,
      the bottom of the hole is smooth to within less than 3 microns RMS,
      a thermally affected zone penetrate less than 2 microns from the bottom of the blind hole, and
      material is removed at an average rate greater than 12 cubic microns per pulse.

16. The method of claim 14 further including the step of circularly polarizing the laser beam.

17. The method of claim 15, further including the step of generating the pulsed laser beam in a manner such that pulse widths of pulses included in the pulsed laser beam are less than 5 picoseconds.

18. The method of claim 15, further including the step of ion beam etching the bottom of the blind hole.

19. The method of claim 15, further including the step of a chemically etching the poly-crystalline material.

20. The method of claim 15, further including the step of rastering the laser beam over the surface of the poly-crystalline material.

21. The method of claim 15, wherein the poly-crystalline material includes silicon.

22. The method of claim 15, wherein the poly-crystalline material includes diamond.

23. The method of claim 15, wherein the poly-crystalline material includes sapphire.

24. The method of claim 15, wherein the poly-crystalline material includes diamond-like graphite.

25. A method of machining holes in poly-crystalline material comprising the steps of:
   providing a laser source configured to produce ultraviolet light pulses less than 1 picosecond wide;
   producing the light pulses;
   focusing the light pulses on a target surface such that a fluence is attained, the fluence being sufficient to remove material at an average rate of at least 12,000 cubic microns per second, and the fluence being less than fluences that would produce pits or spikes greater than 10 microns in size.

26. The method of claim 25 further including the step of elliptically polarizing the light pulses.

27. The method of claim 25, wherein the poly-crystalline material includes silicon.

28. The method of claim 27, further including the step of chemically etching to the poly-crystalline material.

29. The method of claim 27, further including the step of ion beam etching a surface of the machined hole.

30. The method of claim 27, further including the step of applying movement such that the light pulses are rastered over the target surface.

31. The method of claim 27, wherein the fluence is sufficient to remove material at an average rate of at least 12 cubic microns per pulse.

32. The method of claim 25, wherein the poly-crystalline material includes diamond.

33. A method of determining the state of an integrated circuit comprising the steps of:
   laser machining a blind hole in a substrate;
   extending the laser machined hole to the circuit; and
   establishing a connection through the hole between a sensor and the circuit.

34. The method of claim 33, wherein the substrate includes a substrate of the integrated circuit.

35. The method of claim 34, wherein the laser machining step results in thermally affected zone that extends less than 2 microns from a bottom surface of the blind hole.

36. The method of claim 34, wherein the laser machining step removes material at an average rate of at least 12,000 cubic microns per second.

37. The method of claim 34, wherein the step of extending the blind hole includes ion beam etching material from a surface of the blind hole.

38. The method of claim 34, further including the step of chemically etching a surface of the blind hole.

39. The method of claim 33, wherein the integrated circuit includes an optical component.

40. The method of claim 33, wherein the sensor includes an optical component.

41. A method of modifying an integrated circuit comprising the steps of:

laser machining a blind hole in a substrate;

extending the blind hole to the integrated circuit; and exchanging material, through the extended hole, with the integrated circuit.

42. The method of claim 41, wherein the substrate includes material from the group consisting of diamond, diamond-like graphite, $Al_2O_3$, BeO, Aluminum nitride, and sapphire.

43. The method of claim 41, wherein the substrate includes silicon.

44. The method of claim 41, wherein the substrate includes silicon and the laser machining step includes removing material at an average rate of 12,000 cubic microns per second.

45. The method of claim 41, wherein the substrate includes silicon and the laser machining step results in a thermally affected zone that extends less than 5 microns from a bottom surface of the blind hole.

46. The method of claim 41, wherein the substrate includes silicon and the step of extending the blind hole includes ion beam etching.

47. The method of claim 41, further including the step of chemically etching a bottom surface of the blind hole.

48. The method of claim 41, wherein the integrated circuit includes optical components.

49. A method of laser machining a material substantially including silicon, the method comprising the steps of:

generating a pulsed laser beam using a laser system; and removing portions of the material using the pulsed laser beam in a manner such that surfaces smooth to within 2 microns RMS are produced and material is removed at an average rate greater than 6,000 cubic microns per second.

50. The method of claim 49, wherein material is removed at an average rate greater than 12,000 cubic microns per second.

51. The method of claim 49, wherein surfaces smooth to within 0.5 microns RMS are produced.

52. A method of integrated circuit production comprising the steps of:

producing a first circuit on a first side of a substrate;

generating a hole in the substrate at an average rate greater than 12,000 cubic microns per second;

producing a second circuits on a second side of the substrate; the first circuit and the second circuit being coupled through the hole.

53. The method of claim 52, wherein the step of making a hole includes laser machining.

54. The method of claim 52, wherein one of the first circuit or the second circuit is an electromagnetic radiation shield.

55. The method of claim 52, wherein one of the first circuit or the second circuit is a reference voltage plane.

* * * * *